United States Patent
Lv

(10) Patent No.: US 11,322,697 B2
(45) Date of Patent: May 3, 2022

(54) FLEXIBLE ORGANIC LIGHT EMITTING DIODE (OLED) PANEL

(71) Applicant: WUHAN CHINA STAR OPTOELECTRONICS SEMICONDUCTOR DISPLAY TECHNOLOGY CO., LTD., Hubei (CN)

(72) Inventor: Linhong Lv, Hubei (CN)

(73) Assignee: WUHAN CHINA STAR OPTOELECTRONICS SEMICONDUCTOR DSPLAY TECHNOLOGY CO., LTD., Hubei (CN)

( * ) Notice: Subject to any disclaimer, the term of this patent is extended or adjusted under 35 U.S.C. 154(b) by 426 days.

(21) Appl. No.: 16/484,274

(22) PCT Filed: Apr. 29, 2019

(86) PCT No.: PCT/CN2019/084878
§ 371 (c)(1),
(2) Date: Aug. 7, 2019

(87) PCT Pub. No.: WO2020/124926
PCT Pub. Date: Jun. 25, 2020

(65) Prior Publication Data
US 2021/0343952 A1    Nov. 4, 2021

(30) Foreign Application Priority Data

Dec. 19, 2018 (CN) .......................... 201811552162.0

(51) Int. Cl.
*H01L 51/00* (2006.01)
*H01L 27/32* (2006.01)
*H01L 51/52* (2006.01)

(52) U.S. Cl.
CPC ...... *H01L 51/0097* (2013.01); *H01L 27/3246* (2013.01); *H01L 27/3258* (2013.01);
(Continued)

(58) Field of Classification Search
CPC ............. H01L 51/0097; H01L 51/5253; H01L 27/3246; H01L 27/3258; H01L 27/3276; H01L 2251/5338
See application file for complete search history.

(56) References Cited

U.S. PATENT DOCUMENTS 8,837,126 B2 * 9/2014 Cho ...................... G06F 1/1643
361/679.01
9,634,074 B2 * 4/2017 Son .................... H01L 27/3258
(Continued)

FOREIGN PATENT DOCUMENTS

CN     104752365 A    7/2015
CN     104795424 A    7/2015
(Continued)

*Primary Examiner* — Errol V Fernandes
*Assistant Examiner* — Jeremy J Joy

(57) ABSTRACT

A flexible organic light emitting diode (OLED) panel is provided. The flexible OLED panel includes a flexible substrate including a light emitting region, a thinned region, and a wiring region, wherein the light emitting region is adjacent to the wiring region, the thinned region is disposed between the light emitting region and the wiring region, and the thinned region includes: a substrate groove; and a first ductile material disposed in the substrate; a plurality of metal wires disposed on the light emitting region and the wiring region of the flexible substrate; a light emitting layer disposed on one of the metal wires, and the light emitting layer located in the light emitting region; and an encapsulation layer disposed on the light emitting layer, and the encapsulation layer including an encapsulation-layer groove (Continued)

located in the thinned region, wherein the encapsulation-layer groove is opposite to the substrate groove.

8 Claims, 4 Drawing Sheets

(52) U.S. Cl.
CPC ...... *H01L 27/3276* (2013.01); *H01L 51/5253* (2013.01); *H01L 2251/5338* (2013.01)

(56) References Cited

U.S. PATENT DOCUMENTS

| | | | |
|---|---|---|---|
| 10,020,462 B1* | 7/2018 | Ai | H01L 51/524 |
| 10,367,173 B1* | 7/2019 | Wu | H04M 1/0268 |
| 2013/0169515 A1* | 7/2013 | Prushinskiy | H01L 27/3244 |
| | | | 345/55 |
| 2015/0146386 A1* | 5/2015 | Namkung | H01L 51/0097 |
| | | | 361/749 |
| 2016/0101610 A1* | 4/2016 | Namkung | B32B 37/12 |
| | | | 156/196 |
| 2016/0204171 A1* | 7/2016 | Lee | H01L 51/56 |
| | | | 438/34 |
| 2016/0204183 A1* | 7/2016 | Tao | H01L 25/167 |
| | | | 438/34 |
| 2016/0226024 A1* | 8/2016 | Park | H01L 51/5256 |
| 2016/0233289 A1* | 8/2016 | Son | H01L 27/3258 |
| 2017/0040406 A1* | 2/2017 | Park | H05K 1/028 |
| 2017/0042047 A1* | 2/2017 | Oh | G09G 3/20 |
| 2017/0062760 A1* | 3/2017 | Kim | H01L 27/3276 |
| 2017/0170206 A1* | 6/2017 | Lee | H01L 29/78633 |
| 2017/0294621 A1* | 10/2017 | Higano | H01L 27/3276 |
| 2018/0090698 A1* | 3/2018 | Jeong | H01L 51/0097 |
| 2018/0175311 A1* | 6/2018 | Jin | H01L 51/56 |
| 2020/0006680 A1* | 1/2020 | Fang | H01L 27/3244 |
| 2020/0089368 A1* | 3/2020 | Shim | H01L 27/3276 |
| 2020/0119131 A1* | 4/2020 | Ohara | H01L 51/5253 |
| 2020/0273380 A1* | 8/2020 | Ichikawa | H05B 33/12 |
| 2020/0313101 A1* | 10/2020 | Jung | H01L 27/3244 |
| 2020/0403179 A1* | 12/2020 | Hu | H01L 27/3248 |

FOREIGN PATENT DOCUMENTS

| | | |
|---|---|---|
| CN | 106601776 A | 4/2017 |
| CN | 107221550 A | 9/2017 |
| CN | 206685390 U | 11/2017 |
| CN | 107910333 A | 4/2018 |
| CN | 108336115 A | 7/2018 |
| CN | 108364987 A | 8/2018 |

* cited by examiner

FLEXIBLE ORGANIC LIGHT EMITTING DIODE (OLED) PANEL

FIELD OF INVENTION

The present invention relates to a field of display technologies, and more particularly, to a flexible organic light emitting diode (OLED) panel.

BACKGROUND OF INVENTION

In the field of display technologies, the organic light emitting diode (OLED) panels have advantages of high color gamut, high contrast, energy saving, etc., and flexible OLED panels with a foldable/extensible property are one developing direction that people are concerned about.

In current flexible OLED panel technology, please refer to FIG. 1, light emitting regions 11 are connected by wiring regions 12, and the disconnecting regions 13 are formed by hollowing out the other place to increase the folding and extending capabilities of the flexible OLED panel. However, the design of hollowing out the periphery of light emitting regions 11 reduces resisting moisture and external force capabilities, such that the flexible OLED panels fail to pass the more stringent test of reliability analysis (RA). That is, the quality of the flexible OLED panel is degraded, such as a shorter service life or a weaker structural strength. Furthermore, this design requires additional processes and masks, as well as increasing the manufacturing cost and difficulty.

Therefore, it is necessary to provide a flexible OLED panel to solve the problems of the prior art.

SUMMARY OF INVENTION

The object of the present invention provides a flexible organic light emitting diode (OLED) panel that has better capabilities for resisting moisture and external force while increasing the folding and extending capabilities. That is, under the premise of ensuring the quality of the OLED panel, the extending and folding performance of the OLED panel can be improved, such that a flexible display can be achieved.

In order to achieve the aforementioned object of the present invention, the present invention provides a flexible organic light emitting diode (OLED) panel, including:

a flexible substrate having a first surface and a second surface, the second surface opposite to the first surface, the flexible substrate including a light emitting region, a thinned region, and a wiring region, wherein the light emitting region is adjacent to the wiring region, the thinned region is disposed between the light emitting region and the wiring region, and the thinned region includes:

a substrate groove formed on the second surface; and
a first ductile material disposed in the substrate groove;
a plurality of metal wires formed on the first surface;
a light emitting layer disposed above one of the metal wires, and the light emitting layer located in the light emitting region;
an encapsulation layer disposed on the light emitting layer, and the encapsulation layer including an encapsulation-layer groove located in the thinned region, wherein the encapsulation-layer groove is opposite to the substrate groove; and
a second ductile material disposed in the encapsulation-layer groove.

In one embodiment of the present invention, the metal wires are located in the light emitting region and the wiring region of the flexible substrate.

In one embodiment of the present invention, the flexible OLED panel further includes:

a planarization layer disposed on the metal wires and the flexible substrate;
a first conductive layer disposed on the planarization layer, the first conductive layer including a first electrode located in the light emitting region;
a pixel definition layer disposed on the first electrode and the planarization layer; and
a second conductive layer disposed on the pixel definition layer, the second conductive layer including a second electrode located on the light emitting layer and a second conductive wire located on the wiring region.

In one embodiment of the present invention, the first conductive layer and the second conductive layer are made of transparent conductive material.

In one embodiment of the present invention, the first ductile material and the second ductile material include a resin.

In one embodiment of the present invention, the planarization layer has a conductive through hole in the light emitting region, and the conductive through hole is electrically connected to the metal wire located in the light emitting region.

The present invention further provides a flexible organic light emitting diode (OLED) panel, including:

a flexible substrate, including a light emitting region, a thinned region, and a wiring region, wherein the light emitting region is adjacent to the wiring region, the thinned region is disposed between the light emitting region and the wiring region, and the thinned region includes:

a substrate groove; and
a first ductile material disposed in the substrate;
a plurality of metal wires disposed on the light emitting region and the wiring region of the flexible substrate;
a light emitting layer disposed on one of the metal wires, and the light emitting layer located in the light emitting region; and
an encapsulation layer disposed on the light emitting layer, and the encapsulation layer including an encapsulation-layer groove located in the thinned region, wherein the encapsulation-layer groove is opposite to the substrate groove.

In one embodiment of the present invention, a second ductile material is disposed in the encapsulation-layer groove.

In one embodiment of the present invention, the first ductile material and the ductile material include a resin.

The present invention further provides a flexible organic light emitting diode (OLED) panel, including:

a flexible substrate including a light emitting region, a thinned region, and a wiring region, wherein the light emitting region is adjacent to the wiring region, the thinned region is disposed between the light emitting region and the wiring region, and the thinned region includes:

a substrate groove formed on the second surface; and
a first ductile material disposed in the substrate groove;
a plurality of metal wires disposed on the flexible substrate, and the metal wires located in the light emitting region and the wiring region;
a planarization layer disposed on the metal wires and the flexible substrate;

a first conductive layer disposed on the planarization layer, the first conductive layer including a first electrode located in the light emitting region;

a pixel definition layer disposed on the first electrode and the planarization layer;

a light emitting layer disposed in the pixel definition layer and on the first electrode, and the light emitting layer located in the light emitting region;

a second conductive layer disposed on the pixel definition layer, the second conductive layer including a second electrode located on the light emitting layer and a second conductive wire located on the wiring region; and an encapsulation layer disposed on the second conductive layer.

In one embodiment of the present invention, the first ductile material includes a resin.

In one embodiment of the present invention, the encapsulation layer includes an encapsulation-layer groove located in the thinned region, wherein the encapsulation-layer groove is opposite to the substrate groove.

In one embodiment of the present invention, a second ductile material is disposed in the encapsulation-layer groove.

In one embodiment of the present invention, the first ductile material and the ductile material include a resin.

In one embodiment of the present invention, the encapsulation-layer groove exposes a portion of the first ductile material.

In one embodiment of the present invention, the planarization layer and the pixel definition layer only located in the light emitting region and the wiring region.

The beneficial effect: under the premise of ensuring the quality of the OLED panel, the extending and folding performance of the OLED panel are improved and a flexible display is achieved. That is realized by the thinned processes for the encapsulation layer around the lighting emitting region, for the flexible substrate, and for the film layers on the flexible substrate, such as the planarization layer or the pixel definition layer, and by filling the material with well ductility and foldability after the thinned process.

DESCRIPTION OF DRAWINGS

In order to more clearly illustrate the technical solutions in the embodiments or the prior art, the following drawings, which are intended to be used in the description of the embodiments or the prior art, will be briefly described. It will be apparent that the drawings and the following description are only some embodiments of the present invention. Those of ordinary skill in the art may, without creative efforts, derive other drawings from these drawings.

DETAILED DESCRIPTION OF PREFERRED EMBODIMENTS

Figure 1:
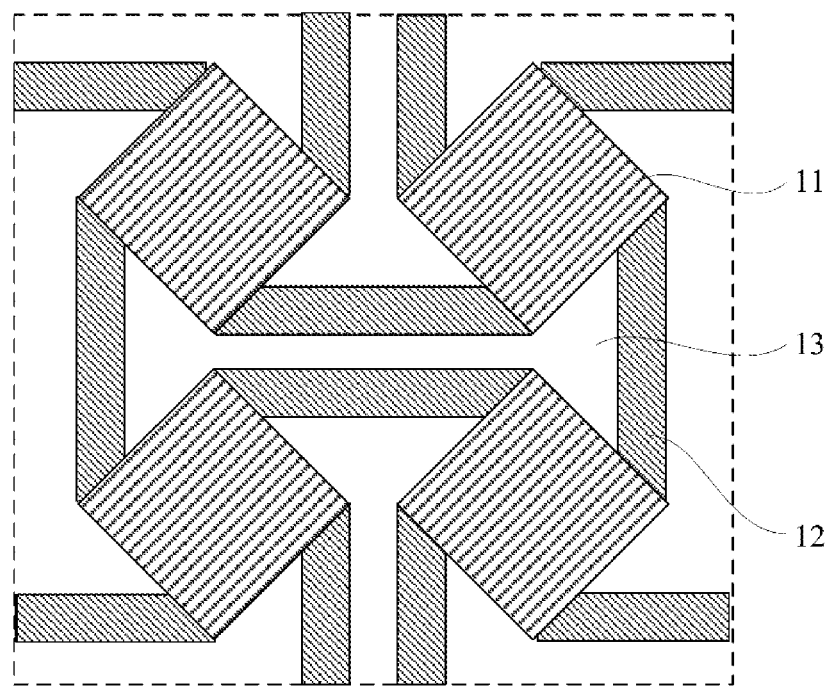
FIG. 1 is a top view of a conventional organic light emitting diode (OLED) panel.

In the following detailed description of the preferred embodiments, reference is made to the accompanying drawings which form a part hereof, and in which is shown by way of illustration specific embodiments in which the invention may be practiced. In this regard, directional terminology, such as "top", "bottom", "front", "back", "left", "right", "inside", "outside", "side", etc., is used with reference to the orientation of the figure(s) being described. As such, the directional terminology is used for purposes of illustration and is in no way limiting. Throughout this specification and in the drawings like parts will be referred to by the same reference numerals.

Figure 2:
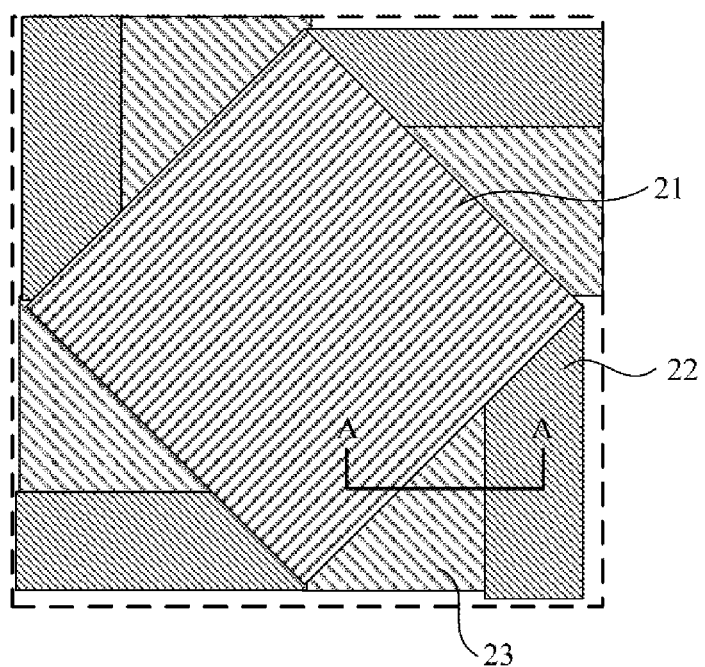
FIG. 2 is a partial structural view of a flexible OLED panel according to one embodiment of the present invention.
Figure 3:
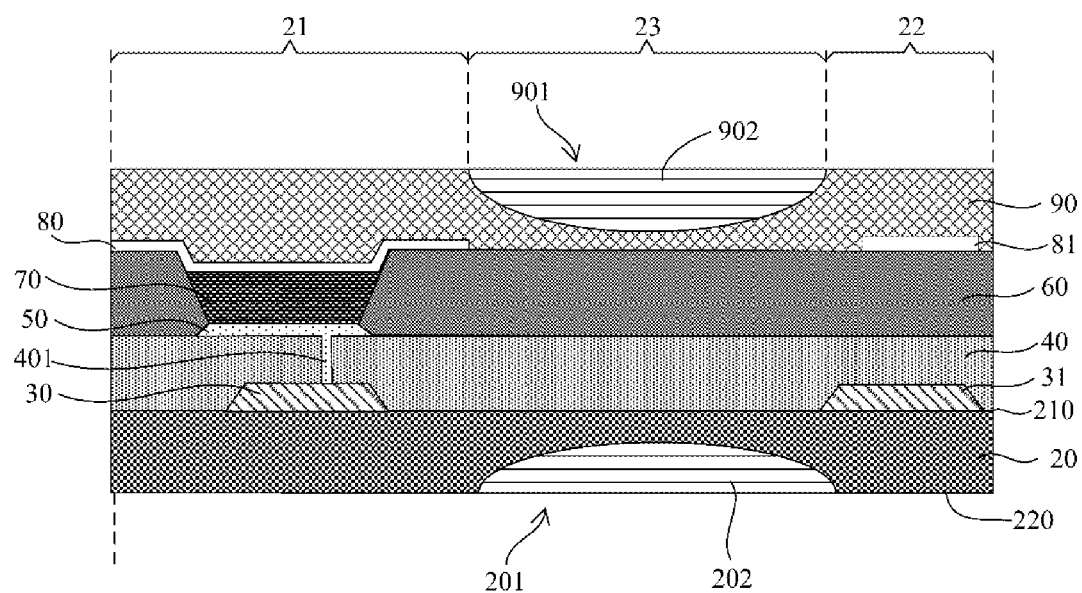
FIG. 3 is a cross-sectional view taken along line A-A of the embodiment in FIG. 2.

Please refer to FIG. 2 and FIG. 3, FIG. 2 is a partial structural view of a flexible OLED panel according to one embodiment of the present invention, and FIG. 3 is a cross-sectional view taken along line A-A of the embodiment in FIG. 2. The embodiment provides a flexible organic light emitting diode (OLED) panel, and the flexible OLED panel includes a flexible substrate 20, a plurality of metal wires 30, 31, a planarization layer 40, a first conductive layer, a pixel definition layer 60, a light emitting layer 70, a second conductive layer 80, and an encapsulation layer 90.

The flexible substrate 20 includes a light emitting region 21, a thinned region 23, and a wiring region 22, wherein the light emitting region 21 is adjacent to the wiring region 22, the thinned region 23 is disposed between the light emitting region 21 and the wiring region 22, and the thinned region 23 includes a substrate groove 201 and a first ductile material 202 disposed in the substrate groove 201. The flexible substrate 20 has a first surface 210 and a second surface 220, the second surface 220 is opposite to the first surface 210. The substrate groove 201 is formed on the second surface 220. The first ductile material 202 may include a resin. Filling the substrate groove 201 with the first ductile material 202 may increase the structural strength of the thinned region 23 to avoid insufficient structural strength due to thinning treatment. Furthermore, filling in the first ductile material 202 may prevent moisture from permeating into the interior of the flexible OLED panel via the thinned region 23.

The metal wires 30, 31 are formed on the first surface 210. The metal wires 30, 31 are located in the light emitting region 21 and the wiring region 22. The metal wires 30, 31 may be formed in the light emitting region 21 and the wiring region 22 from a metal layer by a patterning process. The metal wire 30 located in the light emitting region 22 connects to the first conductive layer, and the metal wire 31 is configured to connect adjacent components or transmit signals.

The planarization layer 40 is disposed on the metal wires 30, and the flexible substrate 20. The planarization layer 40 has a conductive through hole 401 in the light emitting region 21, and the conductive through hole 401 is electrically connected to the metal wire 30 located in the light emitting region 21.

The first conductive layer is disposed on the planarization layer 40, and the first conductive layer includes a first electrode 50 located in the light emitting region 21. The first electrode 50 is electrically connected to the conductive through hole 401. The first conductive layer is formed into the first electrode 50 by using a patterning process. The material of the first conductive layer may be indium tin oxide (ITO) or other transparent conductive material with similar properties.

The pixel definition layer 60 is disposed on the first electrode 50 and the planarization layer 40. The pixel definition layer 60 may include a via for accommodating the light emitting layer 70. The via is disposed on the first electrode 50.

The light emitting layer 70 is disposed above one of the metal wires 30, and the light emitting layer 70 is located in the light emitting region 21. The light emitting layer 70 is disposed in the via of the pixel definition layer 60, and on the first electrode 50. The light emitting layer 70 may be an organic material.

The second conductive layer is disposed on the pixel definition layer 60, the second conductive layer 60 includes a second electrode 80 located on the light emitting layer 70 and a second conductive wire 81 located on the wiring region 22. The second conductive layer is formed into the second electrode 80 and the second conductive wire 81 by a patterning process. The material of the second conductive layer may be indium tin oxide (ITO) or other transparent conductive material with similar properties.

The encapsulation layer 90 is disposed on the light emitting layer 70 and the definition layer 60, and the encapsulation layer 90 includes an encapsulation-layer groove 901 located in the thinned region 23, wherein the encapsulation-layer groove 901 is opposite to the substrate groove 201. A second ductile material 902 is disposed in the encapsulation-layer groove 901. The second ductile material 902 may include a resin, wherein the second ductile material 902 and the first ductile material 202 may the same. Filling the encapsulation-layer groove 901 with the second ductile material 902 may increase the structural strength of the thinned region 23. Furthermore, the second ductile material 902 also can prevent the moisture from permeating into the interior of the flexible OLED panel via the thinned region 23.

Figure 4:
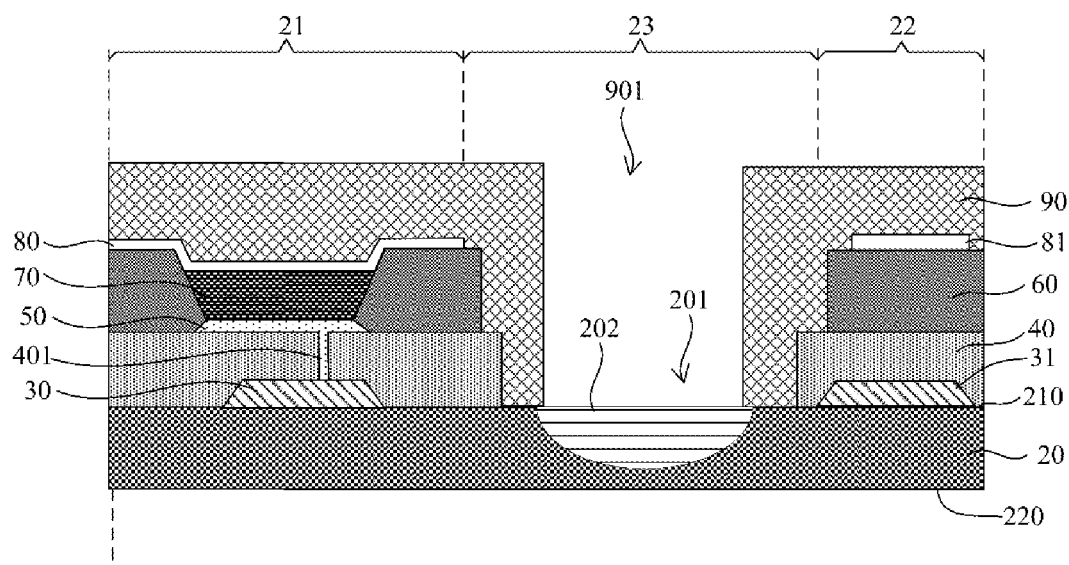
FIG. 4 is a cross-sectional view of a flexible OLED panel according another embodiment of the present invention.

Please refer to FIG. 4, FIG. 4 is a cross-sectional view of a flexible OLED panel according another embodiment of the present invention. The embodiment provides a flexible organic light emitting diode (OLED) panel, and the flexible OLED panel includes a flexible substrate 20, a plurality of metal wires 30, 31, a planarization layer 40, a first conductive layer, a pixel definition layer 60, a light emitting layer 70, a second conductive layer 80, and an encapsulation layer 90.

The flexible substrate 20 includes a light emitting region 21, a thinned region 23, and a wiring region 22, wherein the light emitting region 21 is adjacent to the wiring region 22, the thinned region 23 is disposed between the light emitting region 21 and the wiring region 22, and the thinned region 23 includes a substrate groove 201 and a first ductile material 202 disposed in the substrate groove 201. The flexible substrate 20 has a first surface 210 and a second surface 220, the second surface 220 is opposite to the first surface 210. The substrate groove 201 is formed on the first surface 210 of the flexible substrate 20. The first ductile material 202 may include a resin. Filling the substrate groove 201 with the first ductile material 202 may increase the structural strength of the thinned region 23 to avoid insufficient structural strength due to thinning treatment. Furthermore, filling in the first ductile material 202 may prevent moisture from permeating into the interior of the flexible OLED panel via the thinned region 23.

The metal wires 30, 31 are formed on the first surface 210. The metal wires 30, 31 are located in the light emitting region 21 and the wiring region 22. The metal wires 30, 31 may be formed in the light emitting region 21 and the wiring region 22 from a metal layer by a patterning process. The metal wire 30 located in the light emitting region 22 connects to the first conductive layer, and the metal wire 31 is configured to connect adjacent components or transmit signals.

The planarization layer 40 is disposed on the metal wires 30, and the flexible substrate 20. The planarization layer 40 has a conductive through hole 401 in the light emitting region 21, and the conductive through hole 401 is electrically connected to the metal wire 30 located in the light emitting region 21. The planarization layer 40 is formed in the light emitting region 21 and the wiring region 22 by a patterning process.

The first conductive layer is disposed on the planarization layer 40, and the first conductive layer includes a first electrode 50 located in the light emitting region 21. The first electrode 50 is electrically connected to the conductive through hole 401. The first conductive layer is formed into the first electrode 50 by using a patterning process. The material of the first conductive layer may be indium tin oxide (ITO) or other transparent conductive material with similar properties.

The pixel definition layer 60 is disposed on the first electrode 50 and the planarization layer 40. The pixel definition layer 60 may include a via for accommodating the light emitting layer 70. The via is disposed on the first electrode 50. The pixel definition layer 60 is formed in the light emitting region 21 and the wiring region 22 by a patterning process.

The light emitting layer 70 is disposed above one of the metal wires 30, and the light emitting layer 70 is located in the light emitting region 21. The light emitting layer 70 is disposed in the via of the pixel definition layer 60, and on the first electrode 50. The light emitting layer 70 may be an organic material.

The second conductive layer is disposed on the pixel definition layer 60, the second conductive layer 60 includes a second electrode 80 located on the light emitting layer 70 and a second conductive wire 81 located on the wiring region 22. The second conductive layer is formed into the second electrode 80 and the second conductive wire 81 by a patterning process. The material of the second conductive layer may be indium tin oxide (ITO) or other transparent conductive material with similar properties.

The encapsulation layer 90 is disposed on the light emitting layer 70 and the definition layer 60, and the encapsulation layer 90 includes an encapsulation-layer groove 901 located in the thinned region 23, wherein the encapsulation-layer groove 901 is corresponding to the substrate groove 201. The encapsulation-layer groove 901 exposes a portion of the first ductile material 202.

The difference between the embodiment of FIG. 4 and the embodiment of FIG. 3 is that the substrate groove 201 in FIG. 4 is formed on the first surface 210 of the flexible substrate 20. The encapsulation-layer groove 901 is corresponding to the substrate groove 201, and the encapsulation-layer groove 901 exposes a portion of the first ductile material 202. In addition, the planarization layer 40 and the pixel definition layer 60 are only located in the light emitting region 21 and the wiring region 22. That is, the planarization layer 40 and the pixel definition layer 60 are not disposed in the thinned region 23. Thereby, the extending and folding performance of the OLED can be further improved.

Furthermore, in this embodiment, a second ductile material 902 may further be disposed in the encapsulation-layer groove 901. The second ductile material 902 may include a resin, wherein the second ductile material 902 and the first ductile material 202 may the same. Filling the encapsulation-layer groove 901 with the second ductile material 902 may further increase the structural strength of the thinned region 23. In addition, the second ductile material 902 also can prevent the moisture from permeating into the interior of the flexible OLED panel via the thinned region 23.

The patterning process described above may utilize thin film deposition techniques, photolithography techniques, etching techniques, or other similar techniques that may define the shape, the location, and the size of the pattern. The thin film deposition process described above may utilize physical vapor deposition techniques, chemical vapor deposition techniques, evaporation techniques, sputtering techniques, or other feasible techniques. The lithography techniques described above may also be re placed by other similar techniques which can define the shape, and the location of the pattern. The etching process described above may utilize wet etching techniques or dry etching techniques.

The beneficial effect: under the premise of ensuring the quality of the OLED panel, the extending and folding performance of the OLED panel are improved and a flexible display is achieved. That is realized by the thinned processes for the encapsulation layer around the lighting emitting region, for the flexible substrate, and for the film layers on the flexible substrate, such as the planarization layer or the pixel definition layer, and by filling the material with well ductility and foldability after the thinned process.

In view of the above, although the present invention has been disclosed by way of preferred embodiments, the above preferred embodiments are not intended to limit the present invention, and one of ordinary skill in the art, without departing from the spirit and scope of the invention, the scope of protection of the present invention is defined by the scope of the claims.

What is claimed is:

1. A flexible organic light emitting diode (OLED) panel, comprising:
    a flexible substrate, comprising a light emitting region, a thinned region, and a wiring region, wherein the light emitting region is adjacent to the wiring region, the thinned region is disposed between the light emitting region and the wiring region, and the thinned region comprises:
    a substrate groove formed on a first surface of the flexible substrate; and
    a first ductile material disposed in the substrate groove;
    a plurality of metal wires disposed on the light emitting region and the wiring region of the flexible substrate;
    a light emitting layer disposed on one of the metal wires, and the light emitting layer located in the light emitting region; and
    an encapsulation layer disposed on the light emitting layer, and the encapsulation layer comprising an encapsulation-layer groove located in the thinned region, wherein the encapsulation-layer groove is corresponding to the substrate groove, and wherein the encapsulation-layer groove exposes a portion of the first ductile material.

2. The flexible OLED panel according to claim 1, wherein a second ductile material is disposed in the encapsulation-layer groove.

3. The flexible OLED panel according to claim 2, wherein the first ductile material and the second ductile material comprise a resin.

4. A flexible organic light emitting diode (OLED) panel, comprising:
    a flexible substrate comprising a light emitting region, a thinned region, and a wiring region, wherein the light emitting region is adjacent to the wiring region, the thinned region is disposed between the light emitting region and the wiring region, and the thinned region comprises:
    a substrate groove formed on a first surface of the flexible substrate; and
    a first ductile material disposed in the substrate groove;
    a plurality of metal wires disposed on the flexible substrate, and the metal wires located in the light emitting region and the wiring region;
    a planarization layer disposed on the metal wires and the flexible substrate;
    a first conductive layer disposed on the planarization layer, the first conductive layer comprising a first electrode located in the light emitting region;
    a pixel definition layer disposed on the first electrode and the planarization layer;
    a light emitting layer disposed in the pixel definition layer and on the first electrode, and the light emitting layer located in the light emitting region;
    a second conductive layer disposed on the pixel definition layer, the second conductive layer comprising a second electrode located on the light emitting layer and a second conductive wire located on the wiring region; and
    an encapsulation layer disposed on the second conductive layer, wherein the encapsulation layer comprises an encapsulation-layer groove located in the thinned region, wherein the encapsulation-layer groove is corresponding to the substrate groove, and wherein the encapsulation-layer groove exposes a portion of the first ductile material.

5. The flexible OLED panel according to claim 4, wherein the first ductile material comprises a resin.

6. The flexible OLED panel according to claim 4, wherein a second ductile material is disposed in the encapsulation-layer groove.

7. The flexible OLED panel according to claim 6, wherein the first ductile material and the second ductile material comprise a resin.

8. The flexible OLED panel according to claim 4, wherein the planarization layer and the pixel definition layer only located in the light emitting region and the wiring region.

* * * * *